(12) United States Patent
France et al.

(10) Patent No.: US 10,132,837 B2
(45) Date of Patent: Nov. 20, 2018

(54) TEST BLOCK WITH FARADAY CAGE

(71) Applicant: ABB SCHWEIZ AG, Baden (CH)

(72) Inventors: Philippe France, Chazelles sur Lyon (FR); Alexandre Chaillet, Lyons (FR)

(73) Assignee: ABB SCHWEIZ AG, Baden (CH)

( * ) Notice: Subject to any disclaimer, the term of this patent is extended or adjusted under 35 U.S.C. 154(b) by 39 days.

(21) Appl. No.: 15/481,824

(22) Filed: Apr. 7, 2017

(65) Prior Publication Data

US 2017/0292975 A1    Oct. 12, 2017

(30) Foreign Application Priority Data

Jul. 8, 2016    (EP) ..................................... 16164356

(51) Int. Cl.
*G01R 31/00* (2006.01)
*G01R 1/18* (2006.01)
(Continued)

(52) U.S. Cl.
CPC .............. *G01R 1/18* (2013.01); *G01R 1/0408* (2013.01); *G01R 22/061* (2013.01);
(Continued)

(58) Field of Classification Search
CPC ................ G01R 1/0416; G01R 1/0466; G01R 1/06705; G01R 1/18; G01R 31/2886; G01R 31/001; G01R 31/2801
See application file for complete search history.

(56) References Cited

U.S. PATENT DOCUMENTS 6,605,937 B2 * 8/2003 Germer ................ G01R 22/065
324/156
2007/0205012 A1 * 9/2007 Stachowiak, Jr. ..... G01R 11/04
174/58
(Continued)

FOREIGN PATENT DOCUMENTS

EP    0517123 A1    12/1992
EP    1764618 A1    3/2007

OTHER PUBLICATIONS

Abb France: "Gamme ESSAILEC—Blocs d'essais", Jun. 1, 2014.
(Continued)

*Primary Examiner* — Tung X Nguyen
(74) *Attorney, Agent, or Firm* — Cantor Colburn LLP

(57) ABSTRACT

There is described a test block intended to be implanted in the circuit connecting an apparatus to be tested such as an electricity meter or a protective relay and a power source supplying the apparatus to be tested such as an intensity sensor and/or a voltage sensor, the test block comprising a base including a plurality of inner electric circuits capable of allowing the transmission of information from the power source to the apparatus to be tested and a protective cover intended to be removably assembled with the base in order to form a closed enclosure in which the inner electric circuits are housed. The base and the protective cover are configured such that the removal of the protective cover gives access to a receiving site delimited by the base and capable of receiving, by plugging, a test plug independent of the test block and electrically linked to a test equipment, in particular a voltmeter and/or an ammeter and/or a dummy current source. The base and the protective cover comprise electrically conductive elements linked to each other and configured so as to ensure a continuity and magnetic shielding closure such that the enclosure delimited by the base and the protective cover is a Faraday cage protecting the inner
(Continued)

electric circuits relative to the magnetic fields external to the enclosure delimited by the base and the protective cover.

20 Claims, 3 Drawing Sheets

(51) Int. Cl.
| | |
|---|---|
| G01R 22/06 | (2006.01) |
| G01R 31/28 | (2006.01) |
| G01R 35/04 | (2006.01) |
| H05K 9/00 | (2006.01) |
| G01R 31/319 | (2006.01) |
| G01R 31/327 | (2006.01) |
| G01R 1/04 | (2006.01) |
| G01R 31/44 | (2006.01) |
| G01R 31/3193 | (2006.01) |
| H01R 13/66 | (2006.01) |

(52) U.S. Cl.
CPC ....... *G01R 22/068* (2013.01); *G01R 31/2829* (2013.01); *G01R 31/31905* (2013.01); *G01R 31/31937* (2013.01); *G01R 31/327* (2013.01); *G01R 31/3278* (2013.01); *G01R 31/44* (2013.01); *G01R 35/04* (2013.01); *H05K 9/0049* (2013.01); *H01R 13/665* (2013.01); *H01R 2201/20* (2013.01)

(56) References Cited

U.S. PATENT DOCUMENTS

| | | |
|---|---|---|
| 2012/0128078 A1 | 5/2012 | Billingsley et al. |
| 2014/0273657 A1 | 9/2014 | Hashim et al. |
| 2015/0056864 A1 | 2/2015 | Yamamoto et al. |
| 2015/0213291 A1 | 7/2015 | Gut et al. |

OTHER PUBLICATIONS

European Search Report for Application No. EP 16 16 4356.
Written Opinion for Application No. EP 16 16 4356.
English Translation of EP0517123 (A1) Abstract.

* cited by examiner

TEST BLOCK WITH FARADAY CAGE

CROSS REFERENCE TO RELATED APPLICATIONS

This application claims priority under 35 U.S.C. 119 to the following European Patent Application No. 16164356.4 filed on Apr. 8, 2016, the contents of which are incorporated herein by reference thereto.

BACKGROUND

The present invention concerns a test block intended to be implanted in the circuit connecting an apparatus to be tested, in particular an electricity meter or a protective relay, and a power source, in particular an intensity sensor and/or a voltage sensor, supplying the apparatus to be tested, the test block comprising, on the one hand, a base including a plurality of inner electric circuits capable of allowing the transmission of information from the power source to the apparatus to be tested, on the other hand, a protective cover intended to be removably assembled with the base in order to form a closed enclosure in which the inner electric circuits are housed, the base and the protective cover being configured so that the removal of the protective cover gives access to a receiving site delimited by the base and capable of receiving by plugging a test plug independent of the test block and electrically linked to a test equipment, in particular a voltmeter and/or an ammeter and/or a dummy current source.

For several decades, It is known to implant an electric apparatus known as <<test block>> or <<test connector>> in the electric circuit which connects an apparatus to be tested to the power source which supplies the apparatus to be tested. By way of example, the Applicant commercializes test blocks of this nature under the trade name <<Essailec>>.

Usually, the power source can comprise a voltage sensor and/or an intensity sensor associated with a determined phase of an electric network while the apparatus to be tested can be an electricity meter or a protective relay intended to control at least one circuit breaker likely to act on said phase in case of overvoltage and/or over-current detected by the power source and the protective relay.

Conventionally, the test block comprises a base and a protective cover removably assembled on the base in order to delimit a closed and sealed enclosure according to the standard IP40 when the cover is fastened on the base. The enclosure encloses and protects a plurality of inner electric circuits independent of each other.

On a rear face and/or on a lateral face of the base, the test block comprises a plurality of input sockets allowing linking the inner electric circuits to the power source: each input socket is linked to a single determined inner electric circuit and each inner electric circuit is linked to a single input socket. It is necessary to connect a plurality of connectors in the input sockets and themselves linked to the power source by a cable comprising a plurality of independent conductor strands.

The test block also comprises a plurality of output sockets arranged on the rear face and/or on a lateral face of the base. These output sockets allow linking the inner electric circuits to the apparatus to be tested according to an arrangement in which each output socket is linked to a single inner electric circuit and each inner electric circuit is linked to a single output socket. It is necessary to connect a plurality of connectors to the output sockets and themselves linked to the apparatus to be tested by a cable comprising a plurality of independent conductor strands.

The removal of the protective cover, on the side of the of the front face of the base, gives access to a receiving site delimited by the base and capable of receiving, by plugging, a test plug independent of the test block and electrically linked to a test equipment. Usually, the test equipment may comprise a voltmeter and/or an ammeter and/or a dummy current source. The plugging of the test plug has the effect of acting temporarily on the state and/or the configuration of all or part of the inner electric circuits in a predetermined manner, depending directly on the design of the test plug, allowing carrying out measuring or calibrating operations relative to the apparatus to be tested by means of the test equipment. The test plug comprises actuating elements, configured for this purpose, capable of acting on all or part of the inner electric circuits in an appropriate manner depending on the operation to be carried out.

If the solutions currently implemented are satisfactory in terms of efficiency and robustness, they are not fully satisfactory, after all, in terms of ease of implementation, reliability and quality of measurements and calibrations, or sometimes even safety.

Indeed, the new current and voltage sensors likely to be used at the power source have increasingly low output values in voltage and/or in current. These values are therefore increasingly sensitive to the electromagnetic disturbances generated by the cabinets and also by the environment of the cabinets.

BRIEF SUMMARY

The present invention aims to solve all or part of the disadvantages listed above.

For this purpose, there is proposed a test block intended to be implanted in the circuit connecting an apparatus to be tested such as an electricity meter or a protective relay and a power source supplying the apparatus to be tested, such as an intensity sensor and/or a voltage sensor, the test block comprising:
- a base including a plurality of inner electric circuits capable of allowing the transmission of information from the power source to the apparatus to be tested,
- a protective cover intended to be removably assembled with the base in order to form a closed enclosure in which the inner electric circuits are housed,
- the base and the protective cover being configured such that the removal of the protective cover gives access to a receiving site delimited by the base and capable of receiving by plugging a test plug independent of the test block and electrically linked to a test equipment, in particular a voltmeter and/or an ammeter and/or a dummy current source,
- the base and the protective cover comprising electrically conductive elements linked to each other and configured so as to ensure a continuity and magnetic shielding closure such that the enclosure delimited by the base and the protective cover is a Faraday cage protecting the inner electric circuits relative to the magnetic fields external to the enclosure delimited by the base and the protective cover.

According to a particular embodiment, on all or part of the surface of the outer walls of the base, said outer walls are covered internally and/or externally, or constituted by an aluminum panel.

Preferably, on all or part of the surface of the outer walls of the protective cover, said outer walls are covered internally and/or externally, or constituted by an aluminum panel.

According to another embodiment, the base comprises at least one multi-contact type input socket accessible from the outside of the enclosure and having contacts which are respectively electrically linked to the inner electric circuits such that the input socket is connected to all the inner electric circuits at the same time, the input socket being configured such that it can be connected to a first multi-contact type connector independent of the test block and having contacts electrically linked to the power source, in particular via a multicore cable.

The base preferably comprises at least one multi-contact type output socket accessible from the outside of the enclosure and having contacts which are respectively electrically linked to the inner electric circuits such that the output socket is connected to all the inner electric circuits at the same time, the output socket being configured such that it can be connected to a second multi-contact type connector independent of the test block and having contacts electrically linked to the apparatus to be tested, in particular via a multicore cable.

According to a particular embodiment, the input socket and/or the output socket are each formed by a male or female connector of the RJ45 type comprising a pinning with 8 contact positions, each one of the pins corresponding to a contact of the concerned socket.

Preferably, the base comprises a removable lid whose removal relative to the rest of the base gives access to the inner electric circuits and whose nature and/or shape is adapted to the nature of the input and output sockets and the removable lid comprises a portion of the electrically conductive elements constituting the Faraday cage.

There is also proposed a test appliance comprising such a test block and a test plug capable of being plugged into the receiving site delimited by the base after the removal of the protective cover, the inner electric circuits of the test block and the test plug being configured such that the plugging of the test plug causes a temporary action on all or part of the inner electric circuits of the test block as long as the test plug is plugged, said temporary action being such that it allows carrying out measuring and/or calibrating operations relative to the apparatus to be tested thanks to the test equipment.

According to a particular embodiment, the base comprising at least one multi-contact type input socket accessible from the outside of the enclosure and having contacts which are respectively electrically linked to the inner electric circuits such that the input socket is connected to all the inner electric circuits at the same time, the appliance comprises a first multi-contact type connector capable of being connected to the input socket of the test block, independent of the test block and having contacts electrically linked to the power source via a first multicore cable and the electrically conductive elements which constitute the Faraday cage are linked to the shield of said first multicore cable.

The base comprising at least one multi-contact type output socket accessible from the outside of the enclosure and having contacts which are respectively electrically linked to the inner electric circuits such that the output socket is connected to all the inner electric circuits at the same time, the appliance may comprise a second multi-contact type connector capable of being connected to the output socket of the test block, independent of the test block and having contacts which are electrically linked to the apparatus to be tested via a second multicore cable and the electrically conductive elements which constitute the Faraday cage may be linked to the shield of said second multicore cable.

According to another embodiment, the base of the test block comprises mounting elements allowing fastening the test block on a metallic cabinet and the test block comprises electrically conductive elements linking the electrically conductive elements constituting the Faraday cage to the metallic cabinet when the base is mounted on the electric cabinet.

The test plug preferably comprises, on the one hand, a plurality of actuating elements and a plurality of electric conductors configured so as to act on the inner electric circuits of the base as to cause said temporary action as long as the test plug is plugged in the receiving site delimited by the base and, on the other hand, a multi-contact type output socket having contacts respectively connected to all or part of the electric conductors, the output socket of the test plug being configured such that it can be connected to a third multi-contact connector independent of the test block and the test plug and having contacts electrically linked to the test equipment, in particular via a multicore cable.

According to a particular embodiment, the output socket of the test plug is formed by a male or female connector of the RJ45 type comprising a pinning with 8 contact positions, each one of the pins corresponding to a contact of the output socket of the test plug.

BRIEF DESCRIPTION OF THE DRAWINGS

The invention will be well understood using the following description of particular embodiments of the invention given by way of non-restrictive examples and shown in the appended drawings, wherein.

BRIEF DESCRIPTION

Figure 1:
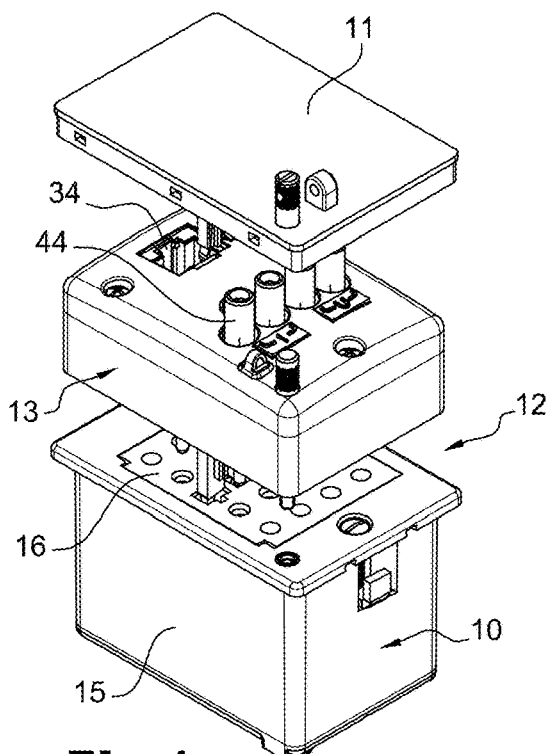
FIGS. 1 to 3 are perspective views of an example of test appliance according to the invention, respectively substantially top, front and substantially bottom views.

With reference to the appended FIGS. 1 to 5 as presented summarily hereinabove, the invention concerns essentially a test block intended to be implanted in the circuit connecting an apparatus to be tested (not shown) and a power source (not shown) supplying the apparatus to be tested.

The power source may comprise a voltage sensor and/or an intensity sensor associated with a determined phase of an electric network, while the apparatus to be tested can be an electricity meter or a protective relay intended to control at least one circuit breaker likely to act on this phase in case of overvoltage and/or over-current detected by the power source and the protective relay.

The test block comprises a base 10 including a plurality of inner electric circuits independent of each other and allowing the transmission of information from the power source to the apparatus to be tested.

The inner electric circuits are intended to convey distinct information from an inner electric circuit to the other, and representative, at each inner electric circuit, of a corresponding physical unit coming from the power source and to be transmitted to the apparatus to be tested when the inner electric circuits are closed. The nature and arrangement of the inner electric circuits can be arbitrary and are not restrictive per se. A particular embodiment, but without any limitation, will be described hereinafter.

For example, it is possible to expect that two inner electric circuits allow the transmission of the measured value of the electric voltage of a phase of an electric network when the power source comprises a voltage sensor associated with this phase, until a protective relay when the apparatus to be tested comprises such a protective relay, likely to actuate a circuit breaker placed on this phase in case of an overvoltage. Also by way of example, it is possible to expect that two other inner electric circuits allow the transmission of the measured value of the electric intensity of a phase of the electric network when the power source comprises an intensity sensor associated with this phase, until a protective relay when the apparatus to be tested comprises such a protective relay, likely to actuate a circuit breaker placed on this phase in case of over-current.

The test block also comprises a protective cover 11 intended to be removably assembled with the base 10 in order to form a closed enclosure in which the inner electric circuits are housed.

For this, as shown, the base 10 may comprise a housing 15 which delimits an open cavity in which the inner electric circuits are implanted and the protective cover 11 sealingly closes this cavity when it is mounted on the base 10, in particular on the housing 15.

It may be advantageously made so that the enclosure delimited by the base 10 and the protective cover 11 is sealed. The sealing of the enclosure provided by the base 10 and the protective cover 11 complies in particular with the standard IP40 when the cover 11 is fastened on the base 10. The base 10 and the protective cover 11 comprise all means necessary to ensure this function.

The base 10 and the protective cover 11 are configured such that the removal of the protective cover 11 gives access to a receiving site 12 delimited by the base 10 and capable of receiving, by plugging, a test plug 13 independent of the test block and electrically linked to a test equipment (not shown). Depending on the nature of the test to be performed, the test equipment may comprise a voltmeter and/or an ammeter and/or a dummy current source.

Figure 2:
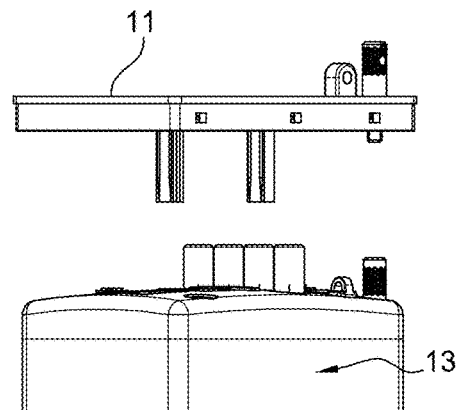
Figure 3:
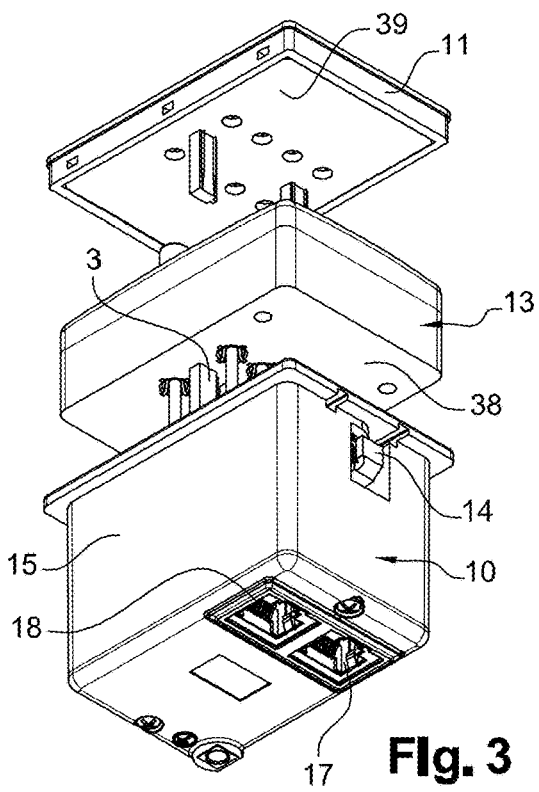

In FIGS. 1 to 3, it is well understood that either the protective cover 11 is fastened on the base 10, or the test plug 13 is fastened on the base 10, but the protective cover 11 is not intended to be fastened on the test plug 13.

The invention also concerns a test appliance comprising such a test block but also the test plug 13 which is capable of being plugged into the receiving site 12 delimited by the base 10 after the removal of the protective cover 11.

The base 10 is intended to be fastened on an electric cabinet. The protective cover 11 defines a front face of the test block when it is mounted on the base 10 in that it is accessible from the outside of the electric cabinet when the test block is mounted on the electric cabinet. The base 10 of the test block comprises mounting elements 14 allowing fastening the test block on the metallic cabinet, for example, as shown, a plurality of retaining tabs each of which can be clamped by a screw dedicated to this operation.

The front face of the base 10, when the protective cover 11 is removed, is constituted by a front cover 16 provided with a plurality of rows of through-holes. The front cover 16 is fastened on the housing 15 by any adapted means, in particular of the snap-fitting type.

The base 10 of the test block comprises at least one multi-contact type input socket 17 accessible from the outside of the enclosure and having contacts respectively electrically linked to the inner electric circuits such that the input socket 17 is connected to all the inner electric circuits at the same time. The input socket 17 is configured such that it can be connected to a first multi-contact type connector (not shown) independent of the test block and having contacts electrically linked to the power source, in particular via a first multicore cable (not shown).

The base 10 of the test block also comprises at least one multi-contact type output socket 18 accessible from the outside of the enclosure and having contacts respectively electrically linked to the inner electric circuits such that the output socket 18 is connected to all the inner electric circuits at the same time. The output socket 18 is configured such that it can be connected to a second multi-contact type connector (not shown) independent of the test block and having contacts electrically linked to the apparatus to be tested, in particular via a second multicore cable (not shown).

For the input socket 17 and for the output socket 18, each contact of the considered socket is linked to a single inner electric circuit and each inner electric circuit is linked to a single contact of this socket. Thus, each inner electric circuit of the test block is capable of electrically linking, when this inner electric circuit is closed, one single contact of the input socket 17 to one single contact of the output socket 18.

The electric connection between the contacts of the input 17 and the output 18 sockets with the inner electric circuits of the test block can be made at a printed circuit 19, known as the <<PCB>> for <<Printed Circuit Board D>>. The nature of the printed circuit 19 depends in particular on the nature of the sockets 17, 18 and the nature of the inner electric circuits.

In this document, the term <<multicore>> means in particular that the concerned cable comprises a plurality of individually insulated electric conductors, and therefore insulated from each other. The term <<multi-contact>> means that the socket 17, 18 or the connector with which the socket 17, 18 cooperates, comprises a plurality of individually insulated electric contacts, and therefore insulated from each other.

According to a particular embodiment fully satisfactory, the input socket 17 and the output socket 18 are each formed by a male or female connector of the RJ45 type, whose other common name is 8P8C (8 positions and 8 electric contacts), comprising a pinning with 8 contact positions, each one of the pins corresponding to a contact of the concerned socket 17, 18.

This characteristic, although advantageous and effective, is not restrictive. The means used to achieve the function presented hereinabove for the sockets 17, 18 can be arbitrary. It is for example possible to expect that the input socket 17 and the output socket 18 are each formed by a male or female connector of the USB type for <<Universal Serial Bus>>.

The base 10 and the protective cover 11 also comprise electrically conductive elements linked to each other and configured so as to ensure a continuity and magnetic shielding closure such that the enclosure delimited by the base 10 and the protective cover 11 is a Faraday cage protecting the inner electric circuits with respect to the magnetic fields external to the enclosure delimited by the base 10 and the protective cover 11.

The base 10 comprises a removable lid 20 whose removal relative to the rest of the base 10 gives access to the inner electric circuits and whose nature and/or shape is adapted to the nature of the input and output sockets 17, 18. The fastening of the removable lid 20 to the housing 15 can be made, for example, by means of screws 21. Another advantage is to be able to adapt the removable lid 20 depending on the nature of the input and output sockets 17, 18 and the printed circuit 19 while using a housing 15 common to the different variants of bases 10 accordingly obtained by replacement or substitution of the input and the output sockets 17, 18 of the removable lid 20 and the printed circuit 19.

The removable lid 20 therefore comprises a portion of the electrically conductive elements which constitute the Faraday cage. The same applies to the housing 15 and to the protective cover 11.

The removable lid 20 is fastened on the housing 15 so as to define the rear face of the base 10, that is to say the face opposite the front face receiving the protective cover 11 and intended to be inwardly facing the electric cabinet. The removable lid 20 comprises openings allowing the input socket 17 and the output socket 18 to be accessible from the outside of the test block from the side of the rear face of the base 10. However, it is still possible to consider that the input socket 17 and/or the output socket 18 may open outwardly from the base 10 at a lateral face of the base 10, that is to say a lateral face of the housing 15 which joins the removable lid 20 to the protective cover 11.

Moreover, the test block comprises electrically conductive elements (not shown) linking the electrically conductive elements which constitute the Faraday cage to the metallic cabinet when the base 10 is mounted on the electric cabinet via the mounting elements 14. Thus, the Faraday cage is electrically linked to the metal of the metallic cabinet.

According to a particular embodiment, on all or part of the surface of the outer walls of the base 10, these outer walls are covered internally and/or externally, or constituted by at least one aluminum panel.

By way of example, the outer walls of the base 10 are externally covered or constituted by aluminum forming a closed continuous panel. For example, it is possible to expect that 5 of the 6 walls of the housing 15 are covered with aluminum so that the lid closes the aluminum parallelepiped of the Faraday cage.

In particular, on all or part of the surface of the outer walls of the removable lid 20, these outer walls are covered internally and/or externally, or constituted by at least one aluminum panel.

By way of example, the outer walls of the lid 20 are externally covered or constituted by aluminum forming a closed continuous panel. In particular, the outer face and/or the inner face of the outer main wall of the removable lid are covered with aluminum, knowing that the 4 faces of the wafer are also made of aluminum.

In parallel, on all or part of the surface of the outer walls of the protective cover 11, these outer walls are covered internally and/or externally, or constituted by at least one aluminum panel.

By way of example, the outer walls of the protective cover 11 are covered internally by a one-piece aluminum panel 39 (visible in FIG. 3) facing the front cover 16 when the protective cover 11 is fastened on the base 10.

It is understood that the aluminum panels present at the base 10 and at the protective cover 11 are all connected to each other so as to form the Faraday cage.

The inner electric circuits of the test block and the test plug 13 are configured such that the plugging of the test plug 13 causes a temporary action on all or part of the inner electric circuits of the test block as long as the test plug 13 is plugged, this temporary action being such that it allows carrying out measuring and/or calibrating operations vis-à-vis the apparatus to be tested thanks to the test equipment.

Figure 4:
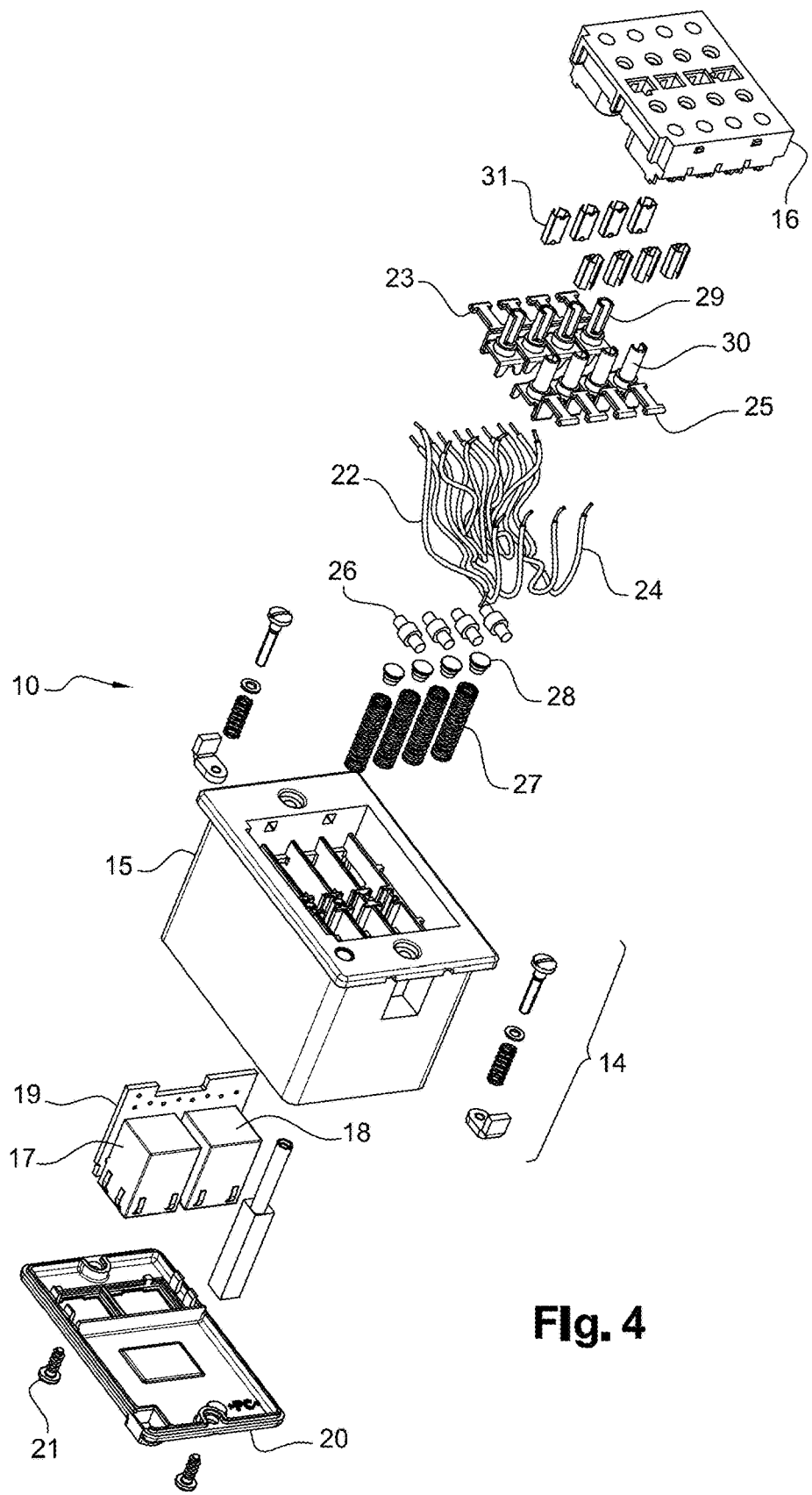
FIG. 4 is an exploded view of the base of the test block of FIGS. 1 to 3.

According to an embodiment as shown in FIG. 4, effective but not restrictive per se, each inner electric circuit of the test block comprises a first electric conductor 22 electrically linked to a contact of the input socket 17 and to a first contact strip 23. Each inner electric circuit also comprises a second electric conductor 24 electrically linked to a contact of the output socket 18 and to a second contact strip 25. The two contact strips 23, 25 can be electrically connected or disconnected, depending on the position occupied by a movable contact 26 adopting, for example, the shape of a roller and biased by a compression spring 27 towards the position conferring the contact between the two strips 23, 25. The interface between the compression spring 27 and the movable contact 26 is made by a pellet 28 mounted at the movable end of the compression spring 27 whose fixed end comes into contact against the housing 15.

According to this assembly, each inner electric circuit is closed as long as the movable contact 26 is in contact with the two strips 23, 25 under the effect of the spring 27. This corresponds to the naturally occupied configuration as long as the test plug 13 is not plugged into the receiving site 12 delimited by the base 10. In contrast, a forced displacement of the movable contact 26 opposite to the action of the spring 27 causes the opening of the inner electric circuit, in the fact that this displacement of the movable contact 26 induces that the two contact strips 23, 25 are no longer in direct electric contact.

The first contact strip 23 comprises a test pad 29 and the second contact strip 25 comprises a test pad 30, whose operation will be explained hereinafter. Each test pad 29, 30 comprises a contact spring 31.

All the inner electric circuits accordingly constituted are housed in the housing 15 of the base 10 and the front cover 16 covers and protects the components of the inner electric circuits.

The front cover 16 comprises:
a first row of through-holes, each through-hole of which is located directly perpendicular to one of the first contact strips 23,
a second row of through-holes, each through-hole of which is located directly perpendicular to one of the test pads 29,
a third row of through-holes, each through-hole of which is located directly perpendicular to one of the movable contacts 26,
a fourth row of through-holes, each through-hole of which is located directly perpendicular to one of the test pads 30,
and a fifth row of through-holes, each through-hole of which is located directly perpendicular to one of the second contact strips 25.

Figure 5:
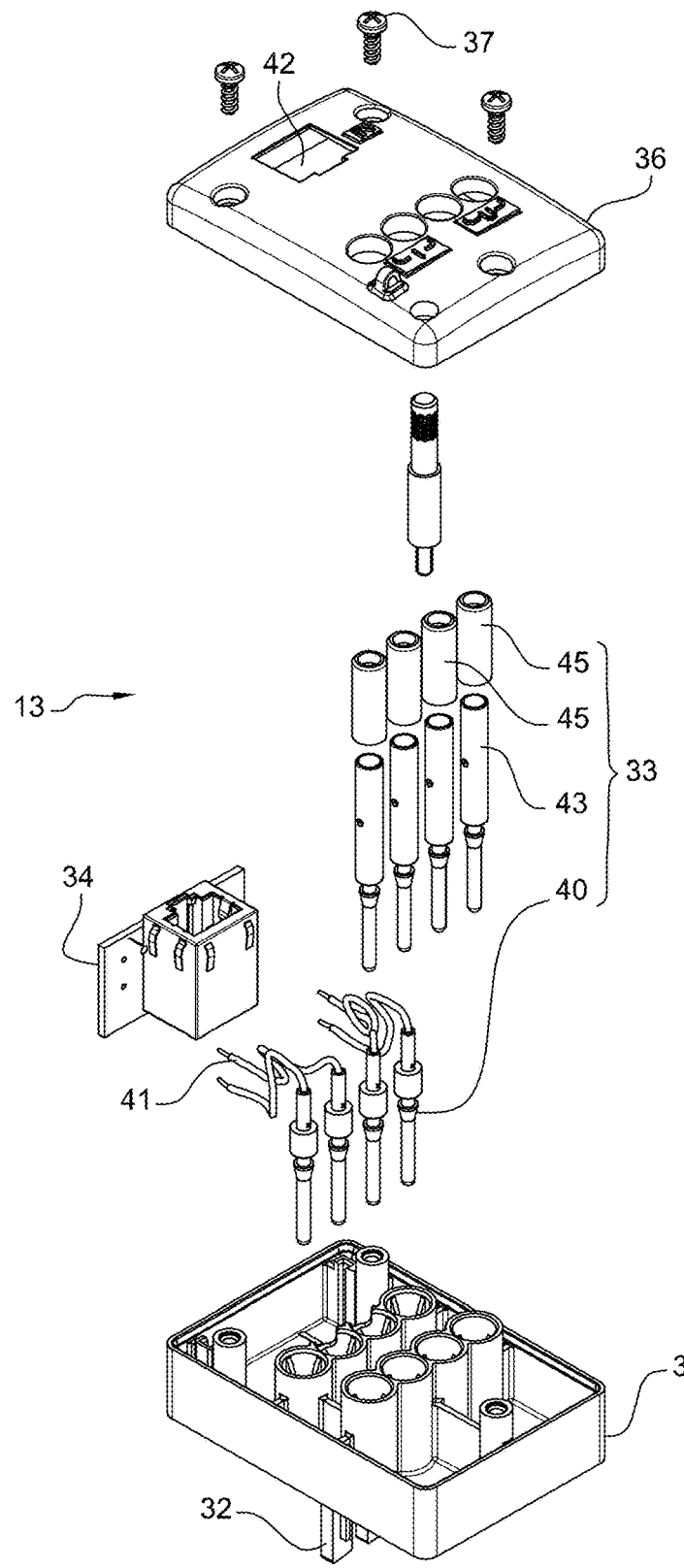
FIG. 5 is an exploded view of the test plug visible in FIGS. 1 to 3.

According to a particular embodiment and with reference now to FIGS. 2 and 5, the test plug 13 comprises, on the one hand, a plurality of actuating elements 32 and a plurality of electric conductors 33 configured so as to act on the inner electric circuits of the base 10 so as to cause the temporary action which has been previously evoked as long as the test plug 13 is plugged into the receiving site 12 delimited by the base 10.

The test plug 13 comprises on the other hand a multi-contact type output socket 34 having contacts respectively connected to all or part of the electric conductors 33, the output socket 34 of the test plug 13 being configured such that it can be connected to a third multi-contact type connector (not shown) independent of the test block and the test plug 13 and having contacts electrically linked to the test equipment, in particular via a third multicore cable (not shown).

According to a particular embodiment, the test plug 13 comprises a housing obtained by the joining of a support 35 delimiting a cavity and a lid 36 closing this cavity. The output socket 34 of the test plug 13 is housed in this cavity and open outwardly from the housing through an opening 42 formed in the lid 36. The lid 36 is fastened on the support 35 by any conceivable mechanical means such as for example by means of a plurality of screws 37. The lid 36 is located on the front face of the test plug 13 whose rear face 38 is intended to come against the front face of the base 10 (more precisely facing the front cover 16) once the protective cover 11 has been removed.

It is specified here that the actuating elements 32 may be constituted by rods protruding from the rear face 38 of the test plug 13, outside of the support 35, and each capable of being inserted into a through-hole of the third row of through-holes formed in the front cover 16. Their height is such that the total insertion of these rods obtained at the moment of bringing the rear face 38 of the test plug 13 into contact against the base 10 causes the displacement of the movable contacts 26 opposite to the action of the compression springs 27 and induces the opening of the inner electric circuits whose movable contact 26 has been displaced.

As shown in FIG. 5, some electric conductors 33 of the test plug 13 each comprise a pin 40 capable of protruding from the rear face 38 to the outside of the support 35. Each pin 40 is capable of being inserted into a through-hole of the fourth row of through-holes formed in the front cover 16 and to be plugged into one of the test pads 30 and is electrically linked to one of the contacts of the output socket 34 by means of a conductive wire 41.

Besides the multi-contact type output socket 34, the test plug 13 may also comprise a plurality of output sockets 44 each of the single-contact type and the other electric conductors 33 of the test plug 13 each comprise a pin 43 protruding from the rear face 38 outwardly from the support 35. Each pin 43 is capable of being inserted into a through-hole of the second row of through-holes formed in the front cover 16 and of being plugged into one of the test pads 29 and is electrically linked to the single contact of one of the single-contact output sockets 44. An insulating cap 45 is added around a portion of the pin 43.

When the test plug 13 is plugged into the receiving site 12 delimited by the base 10, the electric conductors 33 which are connected to the contacts of the output socket 34 of the test plug 13 are plugged into the test pads 30 via the pins 40 and are therefore electrically linked to all or part of the contacts of the output socket 18 of the base 10 of the test block by means of all or part of the inner electric circuits, in particular via the second strips 25 and via the electric conductors 24. At the same time, the electric conductors 33 which are connected to the contacts of the output sockets 44 of the test plug 13 are plugged to the test pads 29 via the pins 43 and are therefore electrically linked to all or part of the contacts of the input socket 17 of the base 10 of the test block by means of all or part of the inner electric circuits, in particular via the first strips 23 and via the electric conductors 22.

In the illustrated example, the actuating elements 32, the electric conductors 33 and the arrangement of the inner electric circuits of the base 10 are arranged so as to operate according to a test principle with short-circuited contacts. Thus, the inner electric circuit is automatically short-circuited upon the plugging of the test plug 13. In normal operation, the base 10 ensures the electric continuity as long as the protective cover 11 is mounted on the base 10. At the time of the test, the cover 11 is removed. At the time of the plugging of the test plug 13, the pins 40, 43 of the test plug 13 come firstly into contact with the test pads 29, 30 of the base 10 in order to establish the test circuit via the electric conductors 33. Only after the test plug 13 is completely inserted into the base 10, the movable contact 26 opens the contact between the contact strips 23, 25 in order to completely by-pass the current via the electric conductors 33. At the time of the return to service at the end of the test, thanks to the movable contact 26 biased by the compression spring 27, the inner electric circuit is automatically closed when the test plug 13 is disconnected from the base 10.

This characteristic is not, however, restrictive and it is possible to provide an arrangement of the test plug 13 and of the base 10 such that they operate according to a test principle with open contacts (the inner electric circuit is open when the protective cover 11 is removed and the apparatus to be tested is no longer supplied) or according to a test principle with closed contacts (the electric connection being permanent, the inner electric circuit remains closed during the test).

The output socket of the test plug 13 is formed by a male or female connector of the RJ45 type comprising a pinning with 8 contact positions, each one of the pins corresponding to a contact of the output socket of the test plug.

The test appliance comprises the first connector previously evoked, which is of the multi-contact type, independent of the test block and the test plug 13, complementary to the input socket 17 of the test block so that it can be connected to the input socket 17 of the test block and having contacts which are electrically linked to the power source, in particular via the first multicore cable. The input socket 17 of the test block and the first connector are configured so that the electric connection between the inner electric circuits of the test block and the power source results from the connection action of the first connector with the input socket 17 of the test block. The first connector may be in particular of the RJ45 type and have a nature complementary to the nature of the input socket 17.

According to a particular embodiment, the electrically conductive elements constituting the Faraday cage are linked to the shield of the first multicore cable.

The test appliance also comprises the second connector previously evoked, which is of the multi-contact type, independent of the test block and the test plug 13, complementary to the output socket 18 of the test block so that it can be connected to the output socket 18 of the test block and having contacts electrically linked to the apparatus to be tested, in particular via the second multicore cable. The output socket 18 of the test block and the second connector are configured so that the electric connection between the inner electric circuits and the apparatus to be tested results from the connection action of the second connector with the output socket 18 of the test block. The second connector may be in particular of the RJ45 type and have a nature complementary to the nature of the output socket 18.

Advantageously, the electrically conductive elements which constitute the Faraday cage are linked to the shield of the second multicore cable.

Finally, the test appliance comprises the third connector of the multi-contact type previously evoked, which is independent of the test block and of the test plug, complementary to the output socket 34 of the test plug 13 so that it can be connected to the output socket 34 of the test plug 13 and having contacts electrically linked to the test equipment, in particular via the third multicore cable. The output socket 34 of the test plug 13 and the third connector are configured so that the electric connection of the electric conductors 33 of the test plug 13 to the test equipment results from the connection action of the third connector in the output socket 34 of the test plug 13. The third connector may be in particular of the RJ45 type and have a nature complementary to the nature of the output socket 34.

The test block which has just been described is simple, robust, easy, practical to use and economical. The number of sockets is low and it is necessary to handle few electric connectors, which increases its reliability by providing a limited number of parts. Moreover, the reliability and quality of the measurements and the calibrations are very good, as well as the safety.

What is claimed is:

1. A test block intended to be implanted in the circuit connecting an apparatus to be tested such as an electricity meter or a protective relay and a power source supplying the apparatus to be tested such as an intensity sensor and/or a voltage sensor, the test block comprising:
   a base including a plurality of inner electric circuits capable of allowing the transmission of information from the power source to the apparatus to be tested,
   a protective cover intended to be removably assembled with the base in order to form a closed enclosure in which the inner electric circuits are housed,
   the base and the protective cover being configured so that the removal of the protective cover gives access to a receiving site delimited by the base and capable of receiving by plugging a test plug independent of the test block and electrically linked to a test equipment, in particular a voltmeter and/or an ammeter and/or a dummy current source, the test block being characterized in that the base and the protective cover comprise electrically conductive elements linked to each other and configured so as to ensure a continuity and magnetic shielding closure such that the enclosure delimited by the base and the protective cover is a Faraday cage protecting the inner electric circuits relative to the magnetic fields external to the enclosure delimited by the base and the protective cover.

2. The test block according to claim 1, characterized in that on all or part of the surface of the outer walls of the base, said outer walls are covered internally and/or externally, or constituted by an aluminum panel.

3. The test block according to claim 1, characterized in that on all or part of the surface of the outer walls of the protective cover, said outer walls are covered internally and/or externally, or constituted by an aluminum panel.

4. The test block according to claim 1, characterized in that the base comprises at least one multi-contact type input socket accessible from the outside of the enclosure and having contacts which are respectively electrically linked to the inner electric circuits in such a way that the input socket is connected to all the inner electric circuits at the same time, the input socket being configured such that it can be connected to a first multi-contact type connector independent of the test block and having contacts electrically linked to the power source, in particular via a multicore cable.

5. The test block according to claim 1, characterized in that the base comprises at least one multi-contact type output socket accessible from the outside of the enclosure and having contacts which are respectively electrically linked to the inner electric circuits in such a way that the output socket is connected to all the inner electric circuits at the same time, the output socket being configured such that it can be connected to a second multi-contact type connector independent of the test block and having contacts electrically linked to the apparatus to be tested, in particular via a multicore cable.

6. The test block according to claim 5, characterized in that the input socket and/or the output socket are each formed by a male or female connector of the RJ45 type comprising a pinning with 8 contact positions, each of the pins corresponding to a contact of the concerned socket.

7. The test block according to claim 6, characterized in that the base comprises a removable lid whose removal relative to the rest of the base gives access to the inner electric circuits and whose nature and/or shape is adapted to the nature of the input and output sockets and in that the removable lid comprises a portion of the electrically conductive elements which constitute the Faraday cage.

8. A test appliance comprising a test block according to claim 1 further comprising a test plug capable of being plugged into the receiving site delimited by the base after the removal of the protective cover, the inner electric circuits of the test block and the test plug being configured such that the plugging of the test plug causes a temporary action on all or part of the inner electric circuits of the test block as long as the test plug is plugged, said temporary action being such that it allows carrying out measuring and/or calibrating operations relative to the apparatus to be tested thanks to the test equipment.

9. The test appliance according to claim 8, characterized in that the base comprising at least one multi-contact type input socket accessible from outside the enclosure and having contacts which are respectively electrically linked to the inner electric circuits in such a way that the input socket is connected to all the inner electric circuits at the same time, the appliance comprises a first multi-contact type connector capable of being connected to the input socket of the test block, independent of the test block and having contacts electrically linked to the power source via a first multicore cable and in that the electrically conductive elements which constitute the Faraday cage are linked to the shield of said first multicore cable.

10. The appliance according to claim 8, characterized in that the base comprising at least one multi-contact type output socket accessible from the outside of the enclosure and having contacts which are respectively electrically linked to the inner electric circuits in such a way that the output socket is connected to all the inner electric circuits at the same time, the appliance comprises a second multi-contact type connector capable of being connected to the output socket of the test block, independent of the test block and having contacts electrically linked to the apparatus to be tested via a second multicore cable, and in that the electrically conductive elements which constitute the Faraday cage are linked to the shield of said second multicore cable.

11. The test appliance according to claim 8, characterized in that the base of the test block comprises mounting elements allowing fastening the test block on a metallic cabinet, and in that the test block comprises electrically conductive elements linking the electrically conductive elements which constitute the Faraday cage to the metallic cabinet when the base is mounted on the electric cabinet.

12. The test appliance according to claim 8, characterized in that the test plug comprises, on the one hand, a plurality of actuating elements and a plurality of electric conductors configured so as to act on the inner electric circuits of the base so as to cause said temporary action as long as the test plug is plugged in the receiving site delimited by the base and, on the other hand, a multi-contact type output socket having contacts which are respectively connected to all or part of the electric conductors, the output socket of the test plug being configured such that it can be connected to a third multi-contact connector independent of the test block and the test plug and having contacts electrically linked to the test equipment, in particular via a multicore cable.

13. The test appliance according to claim 12, characterized in that the output socket of the test plug is formed by a male or female connector of the RJ45 type comprising a pinning with 8 contact positions, each one of the pins corresponding to a contact of the output socket of the test plug.

14. The test block according to claim 2, characterized in that on all or part of the surface of the outer walls of the protective cover, said outer walls are covered internally and/or externally, or constituted by an aluminum panel.

15. The test block according to claim 14, characterized in that the base comprises at least one multi-contact type input socket accessible from the outside of the enclosure and having contacts which are respectively electrically linked to the inner electric circuits in such a way that the input socket is connected to all the inner electric circuits at the same time, the input socket being configured such that it can be connected to a first multi-contact type connector independent of the test block and having contacts electrically linked to the power source, in particular via a multicore cable.

16. The test block according to claim 2, characterized in that the base comprises at least one multi-contact type input socket accessible from the outside of the enclosure and having contacts which are respectively electrically linked to the inner electric circuits in such a way that the input socket is connected to all the inner electric circuits at the same time, the input socket being configured such that it can be connected to a first multi-contact type connector independent of the test block and having contacts electrically linked to the power source, in particular via a multicore cable.

17. The test block according to claim 3, characterized in that the base comprises at least one multi-contact type input socket accessible from the outside of the enclosure and having contacts which are respectively electrically linked to the inner electric circuits in such a way that the input socket is connected to all the inner electric circuits at the same time, the input socket being configured such that it can be connected to a first multi-contact type connector independent of the test block and having contacts electrically linked to the power source, in particular via a multicore cable.

18. The test block according to claim 17, characterized in that the base comprises at least one multi-contact type output socket accessible from the outside of the enclosure and having contacts which are respectively electrically linked to the inner electric circuits in such a way that the output socket is connected to all the inner electric circuits at the same time, the output socket being configured such that it can be connected to a second multi-contact type connector independent of the test block and having contacts electrically linked to the apparatus to be tested, in particular via a multicore cable.

19. The test block according to claim 18, characterized in that the input socket and/or the output socket are each formed by a male or female connector of the RJ45 type comprising a pinning with 8 contact positions, each of the pins corresponding to a contact of the concerned socket.

20. The test block according to claim 19, characterized in that the base comprises a removable lid whose removal relative to the rest of the base gives access to the inner electric circuits and whose nature and/or shape is adapted to the nature of the input and output sockets and in that the removable lid comprises a portion of the electrically conductive elements which constitute the Faraday cage.

\* \* \* \* \*